(12) United States Patent
Chou et al.

(10) Patent No.: US 12,248,699 B2
(45) Date of Patent: Mar. 11, 2025

(54) CLOCK CONTROL CIRCUIT, MEMORY STORAGE DEVICE AND CLOCK CONTROL METHOD

(71) Applicant: PHISON ELECTRONICS CORP., Miaoli (TW)

(72) Inventors: Cheng-Jui Chou, Hsinchu County (TW); Kuen-Chih Lin, New Taipei (TW)

(73) Assignee: PHISON ELECTRONICS CORP., Miaoli (TW)

(*) Notice: Subject to any disclaimer, the term of this patent is extended or adjusted under 35 U.S.C. 154(b) by 121 days.

(21) Appl. No.: 18/332,766

(22) Filed: Jun. 12, 2023

(65) Prior Publication Data

US 2024/0402936 A1    Dec. 5, 2024

(30) Foreign Application Priority Data

May 30, 2023   (TW) ................. 112120124

(51) Int. Cl.
  *G06F 3/06*   (2006.01)
  *G06F 1/04*   (2006.01)
  *G11C 7/22*   (2006.01)

(52) U.S. Cl.
  CPC .............. *G06F 3/0655* (2013.01); *G06F 1/04* (2013.01); *G06F 3/061* (2013.01); *G06F 3/0679* (2013.01); *G11C 7/222* (2013.01)

(58) Field of Classification Search
  CPC .......... G06F 3/0655; G06F 1/04; G06F 3/061; G06F 3/0679; G11C 7/222
  USPC ........................................ 365/233.1
  See application file for complete search history.

(56) References Cited

U.S. PATENT DOCUMENTS

| 2010/0122106 A1* | 5/2010 | Lee ..................... G06F 1/12 713/503 |
| 2014/0204075 A1 | 7/2014 | Zhang et al. |
| 2019/0043545 A1* | 2/2019 | Boehm ................. G11C 7/222 |

FOREIGN PATENT DOCUMENTS

| TW | I424423 | 1/2014 |
| TW | 202145017 | 12/2021 |
| WO | 2004072745 | 8/2004 |

* cited by examiner

*Primary Examiner* — Fernando Hidalgo
(74) *Attorney, Agent, or Firm* — JCIPRNET

(57) ABSTRACT

A clock control circuit, a memory storage device, and a clock control method are disclosed. The method includes: tracking a frequency of a first signal from a host system; generating, in a first mode, a clock signal according to the frequency of the first signal; and generating, in a second mode, the clock signal without reference to the frequency of the first signal.

33 Claims, 3 Drawing Sheets

CLOCK CONTROL CIRCUIT, MEMORY STORAGE DEVICE AND CLOCK CONTROL METHOD

CROSS-REFERENCE TO RELATED APPLICATION

This application claims the priority benefit of Taiwan application serial no. 112120124, filed on May 30, 2023. The entirety of the above-mentioned patent application is hereby incorporated by reference herein and made a part of this specification.

BACKGROUND OF THE INVENTION

Field of the Invention

The invention relates to a clock control technique, and in particular to a clock control circuit, a memory storage device, and a clock control method.

Description of Related Art

Some types of memory storage devices generate a clock signal via a non-crystal oscillator, and adjust the frequency of the clock signal by tracking the frequency of the host system. By controlling the frequency of the host system to be consistent with the frequency of the clock signal inside the memory storage device, normal communication between the host system and the memory storage device may be maintained.

However, in certain situations, for example, when the frequency of the host system exceeds the default frequency range, the frequency of the clock signal inside the memory storage device may not be smoothly calibrated to be consistent with the frequency of the host system. As a result, the connection between the host system and the memory storage device is interrupted and/or repeated data or command retransmissions between the host system and the memory storage device are needed.

SUMMARY OF THE INVENTION

The invention provides a clock control circuit, a memory storage device, and a clock control method that may improve the clock control efficiency of the memory storage device.

An exemplary embodiment of the invention provides a clock control circuit including a frequency tracking circuit, a clock signal generation circuit, and a control circuit. The clock signal generation circuit is coupled to the frequency tracking circuit. The control circuit is coupled to the frequency tracking circuit and the clock signal generation circuit. The frequency tracking circuit is configured to track a frequency of a first signal from a host system. The control circuit is configured to control the clock signal generation circuit to generate, in a first mode, a clock signal according to the frequency of the first signal. The control circuit is further configured to control the clock signal generation circuit to generate, in a second mode, the clock signal without reference to the frequency of the first signal.

An exemplary embodiment of the invention further provides a memory storage device including a connection interface unit, a rewritable non-volatile memory module, and a memory control circuit unit. The connection interface unit is configured to be coupled to a host system. The memory control circuit unit is coupled to the connection interface unit and the rewritable non-volatile memory module. The clock control circuit is disposed in the connection interface unit. The clock control circuit is configured to: track a frequency of a first signal from the host system; generate, in a first mode, a clock signal according to the frequency of the first signal; and generate, in a second mode, the clock signal without reference to the frequency of the first signal.

An exemplary embodiment of the invention further provides a clock control method used in a memory storage device. The clock control method includes: tracking a frequency of a first signal from a host system; generating, in a first mode, a clock signal according to the frequency of the first signal; and generating, in a second mode, the clock signal without reference to the frequency of the first signal.

Based on the above, the frequency of the first signal from the host system may be tracked, and the clock signal may be generated, in the first mode, according to the tracked frequency of the first signal. Furthermore, the clock signal may be generated, in the second mode, without reference to the frequency of the first signal. In this way, no matter how the frequency of the host system is changed, the frequency of the clock signal may be effectively controlled.

DESCRIPTION OF THE EMBODIMENTS

A plurality of embodiments are presented below to illustrate the invention, but the invention is not limited to the plurality of embodiments illustrated. Appropriate combinations are also allowed between the embodiments. The term "coupled" used in the entire text of the specification of the present application (including claims) may refer to any direct or indirect connecting means. For example, if it is described in the text that a first device is coupled to a second device, it should be interpreted as that the first device may be directly connected to the second device, or the first device may be indirectly connected to the second device via other devices or some connection means. Additionally, the term "signal" may refer to at least one current, voltage, charge, temperature, data, or any other signal or a plurality of signals.

Figure 1:
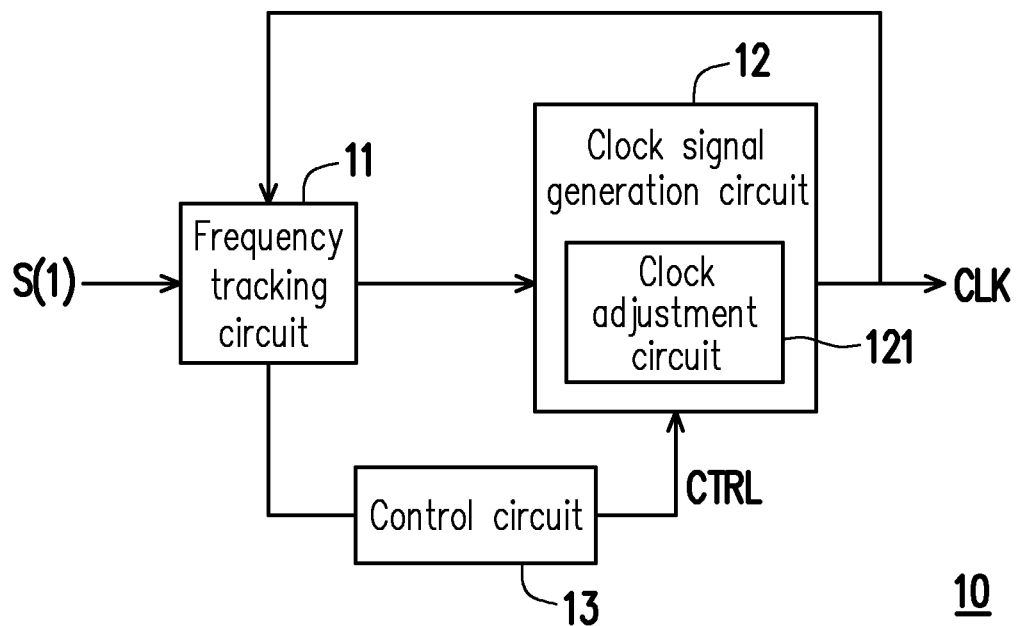
FIG. 1 is a schematic diagram of a clock control circuit shown according to an exemplary embodiment of the invention.

FIG. 1 is a schematic diagram of a clock control circuit shown according to an exemplary embodiment of the invention. Please refer to FIG. 1, a clock control circuit 10 may be configured to receive a signal (also referred to as a first signal) S(1) and generate a signal (also referred to as a clock signal) CLK. In an exemplary embodiment, the clock control circuit 10 may include a clock and data recovery (CDR) circuit.

It should be noted that the clock control circuit 10 may be operated in various modes. For example, the plurality of modes include a first mode and a second mode. The clock control circuit 10 may track the frequency of the signal S(1) and generate, in the first mode, the signal CLK according to the tracked frequency of the signal S(1). Furthermore, the clock control circuit 10 may generate, in the second mode, the signal CLK without reference to the frequency of the signal S(1).

It should be noted that, in an embodiment, the frequency of one signal may only refer to the frequency of the signal, or include both the frequency and the phase of the signal. In addition, in an embodiment, the frequency difference between two signals may also refer to the frequency difference of the two signals alone, or include both the frequency difference and the phase difference of the two signals.

The clock control circuit 10 includes a frequency tracking circuit 11, a clock signal generation circuit 12, and a control circuit 13. The frequency tracking circuit 11 is coupled to the clock signal generation circuit 12. The frequency tracking circuit 11 is configured to track the frequency of the signal S(1) in real time and transmit the frequency tracking result to the clock signal generation circuit 12.

The control circuit 13 is coupled to the frequency tracking circuit 11 and the clock signal generation circuit 12. The control circuit 13 may control the clock signal generation circuit 12 to generate, in the first mode, the signal CLK according to the frequency tracking result of the frequency tracking circuit 11. For example, the control circuit 13 may send, in the first mode, a signal (also referred to as a control signal) CTRL to instruct the clock signal generation circuit 12 to control (e.g., adjust) the frequency of the signal CLK according to the frequency tracking result of the frequency tracking circuit 11. In addition, the signal CLK may be fed back to the frequency tracking circuit 11. The frequency tracking circuit 11 may also track the frequency of the signal CLK.

Moreover, the control circuit 13 may control the clock signal generation circuit 12 to generate, in the second mode, the signal CLK without reference to the frequency of the signal S(1). For example, the control circuit 13 may send, in the second mode, the signal CTRL to instruct the clock signal generation circuit 12 to control (e.g., adjust) the frequency of the signal CLK without reference to the frequency of the signal S(1). In an exemplary embodiment, the control circuit 13 may cut off, in the second mode, the signal transmission path between the frequency tracking circuit 11 and the clock signal generation circuit 12. In an exemplary embodiment, in the second mode, the control circuit 13 may turn off the frequency tracking circuit 11.

In an exemplary embodiment, the control circuit 13 may obtain the frequency difference between the signals S(1) and CLK according to the frequency tracking result of the frequency tracking circuit 11. For example, the control circuit 13 may obtain one parameter value according to the frequency tracking result of the frequency tracking circuit 11. This parameter value may reflect the frequency difference between the signals S(1) and CLK. For example, the frequency difference may reflect the difference between the frequency of the signal S(1) and the frequency of the signal CLK. Then, the control circuit 13 may decide to be operated in the first mode or the second mode according to the frequency difference.

In an exemplary embodiment, the control circuit 13 may determine whether the frequency difference between the signals S(1) and CLK is greater than a default value. For example, the default value may be +/−1000 ppm or other numerical values. In response to the frequency difference being not greater than (i.e., less than or equal to) the default value, the control circuit 13 may be operated in the first mode. Alternatively, in response to the frequency difference being greater than the default value, the control circuit 13 may be operated in the second mode.

In an exemplary embodiment, the control circuit 13 may obtain the transmission standard of the signal S(1) according to the frequency tracking result of the frequency tracking circuit 11. Then, the control circuit 13 may decide to be operated in the first mode or the second mode according to the transmission standard of the signal S(1).

In an exemplary embodiment, the control circuit 13 may determine whether the transmission standard of the signal S(1) is a first transmission standard or a second transmission standard. In response to the transmission standard of the signal S(1) being the first transmission standard, the control circuit 13 may be operated in the first mode. Or, in response to the transmission standard of the signal S(1) being the second transmission standard, the control circuit 13 may be operated in the second mode. For example, the first transmission standard may be Universal Serial Bus (USB) 3.1 Gen 1 and/or the second transmission standard may be USB 3.1 Gen 2, and the invention is not limited thereto.

In an exemplary embodiment, the control circuit 13 may also decide to be operated in the first mode or the second mode according to whether the frequency of the signal S(1) is within a predetermined frequency range. In an exemplary embodiment, in response to the frequency of the signal S(1) being within the predetermined frequency range, the control circuit 13 may be operated in the first mode. In an exemplary embodiment, in response to the frequency of the signal S(1) being not within the predetermined frequency range, the control circuit 13 may be operated in the second mode.

In an exemplary embodiment, the control circuit 13 may also decide to be operated in the first mode or the second mode according to the frequency of the signal S(1) within one or a plurality of specific frequency ranges. In an exemplary embodiment, in response to the frequency of the signal S(1) being within a first frequency range, the control circuit 13 may be operated in the first mode. In an exemplary embodiment, in response to the frequency of the signal S(1) being within a second frequency range, the control circuit 13 may be operated in the second mode. The first frequency range is different from the second frequency range. In addition, the control circuit 13 may also decide to be operated in the first mode or the second mode according to other decision rules, which are not repeated here.

In an exemplary embodiment, the control circuit 13 may adjust, in the first mode, the frequency of the signal CLK according to the frequency difference between the signals S(1) and CLK. By adjusting the frequency of the signal CLK, the frequency difference between the signals S(1) and CLK may be gradually reduced.

In an exemplary embodiment, the control circuit 13 may obtain, in the second mode, one temperature value. The temperature value may be obtained by a temperature sensor (not shown) and may reflect the current ambient temperature or device temperature. In the case of not referencing the frequency of the signal S(1) (that is, in the second mode), the control circuit 13 may adjust the frequency of the signal CLK according to the temperature value. For example, the control circuit 13 may adjust, in the second mode, the frequency of the signal CLK using one of a plurality of compensation parameters according to the temperature value.

In an exemplary embodiment, the clock signal generation circuit 10 supports adjusting, in the first mode, the signal CLK within one frequency adjustment range (also referred to as a first frequency adjustment range), such as adjusting the frequency of the signal CLK. The clock signal generation circuit 10 supports adjusting, in the second mode, the signal CLK within another frequency adjustment range (also referred to as a second frequency adjustment range), such as adjusting the frequency of the signal CLK. The first frequency adjustment range may be different from the second frequency adjustment range. For example, assuming that the adjustment range of frequency corresponding to the first frequency adjustment range is $+\Delta f(1)$ to $-\Delta f(1)$, the adjustment range of frequency corresponding to the second frequency adjustment range may be $+\Delta f(2)$ to $-\Delta f(2)$, and $\Delta f(1)$ may be different from $\Delta f(2)$. The clock signal generation circuit 10 may adjust, in the first mode, the frequency of the signal CLK to increase or decrease by at most $\Delta f(1)$. The clock signal generation circuit 10 may adjust, in the second mode, the frequency of the signal CLK to increase or decrease by at most $\Delta f(2)$.

Figure 2:
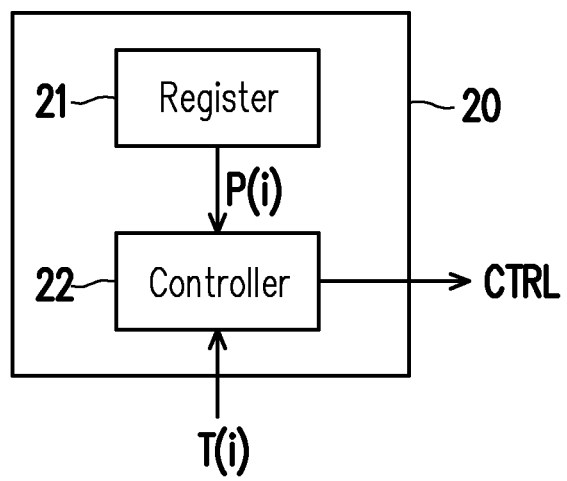
FIG. 2 is a schematic diagram of a control circuit shown according to an exemplary embodiment of the invention.

FIG. 2 is a schematic diagram of a control circuit shown according to an exemplary embodiment of the invention. Please refer to FIG. 1 and FIG. 2, in an exemplary embodiment, the control circuit 13 includes a control circuit 20.

The control circuit 20 includes a register 21 and a controller 22. The register 21 may be configured to store a plurality of compensation parameters. Each compensation parameter may correspond to one temperature value (or one temperature range). The controller 22 is coupled to the register 21. The controller 22 may select, in the second mode, a compensation parameter corresponding to the temperature value from the plurality of compensation parameters according to a temperature value currently measured by a temperature sensor (not shown). Then, the controller 22 may adjust the frequency of the signal CLK using the selected compensation parameter.

In an exemplary embodiment, it is assumed that a temperature value T(i) currently measured by a temperature sensor (not shown) is within one specific temperature range. The controller 22 may select, in the second mode, a compensation parameter P(i) corresponding to the temperature value T(i) (or the specific temperature range) from the register 21 according to the temperature value T(i). The controller 22 may generate the signal CTRL according to the compensation parameter P(i). For example, the signal CTRL may carry the compensation parameter P(i) or setting information related to the compensation parameter P(i). Then, the clock signal generation circuit 12 may adjust the frequency of the signal CLK according to the signal CTRL. Thus, even if the frequency of the signal S(1) is not tracked, the frequency of the signal CLK may still be dynamically adjusted (e.g., increased or decreased) according to the current temperature.

Please return to FIG. 1, the clock signal generation circuit 12 may include a clock adjustment circuit 121. The clock adjustment circuit 121 is coupled to the frequency tracking circuit 11 and the control circuit 13. The clock adjustment circuit 121 may adjust, in the first mode, the frequency of the signal CLK according to the frequency difference between the signals S(1) and CLK. The clock adjustment circuit 121 may adjust, in the second mode, the frequency of the signal CLK according to the instruction (such as the signal CTRL) of the control circuit 13. For example, in the second mode, the control circuit 13 may adjust the internal setting value of the clock adjustment circuit 121 according to the selected compensation parameter (such as the compensation parameter P(i) of FIG. 3). Then, the clock adjustment circuit 121 may output the signal CLK having a specific frequency (or change the frequency of the signal CLK) according to the adjusted setting value. For example, the clock adjustment circuit 121 may include a circuit such as a frequency divider or a phase interpolator that may adjust the frequency of the signal CLK.

Figure 3:
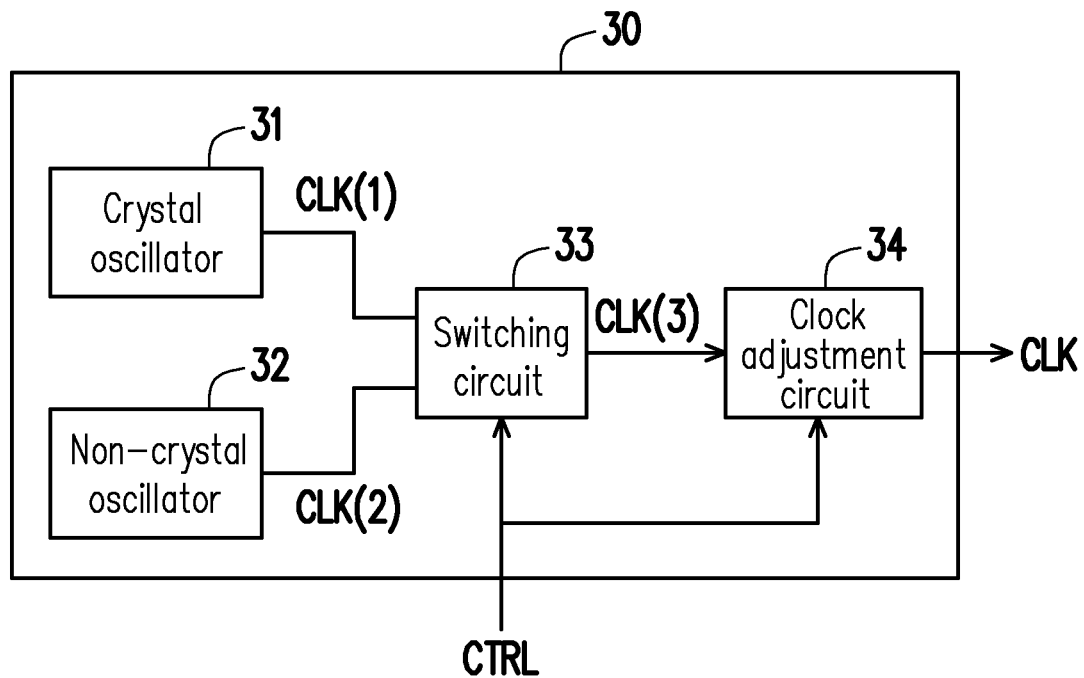
FIG. 3 is a schematic diagram of a clock signal generation circuit shown according to an exemplary embodiment of the invention.

FIG. 3 is a schematic diagram of a clock signal generation circuit shown according to an exemplary embodiment of the invention. Please refer to FIG. 1 and FIG. 3, in an exemplary embodiment, the clock signal generation circuit 12 includes a clock signal generation circuit 30.

The clock signal generation circuit 30 includes a crystal oscillator 31, a non-crystal oscillator 32, a switching circuit 33, and a clock adjustment circuit 34. The crystal oscillator 31 is also referred to as a quartz crystal oscillator. The crystal oscillator 31 may be configured to generate a signal (also referred to as a first clock signal) CLK(1). For example, the crystal oscillator 31 may include a quartz crystal and generate the signal CLK(1) having a specific frequency based on the characteristics of the quartz crystal itself after being powered on.

The non-crystal oscillator 32 may be configured to generate a signal (also referred to as a second clock signal) CLK(2). The non-crystal oscillator 32 does not include a quartz crystal. For example, the non-crystal oscillator 32 may include an RC oscillating circuit and generate the signal CLK(2) having a specific frequency based on the electrical characteristics of the RC oscillating circuit after being powered on.

The switching circuit 33 is coupled to the crystal oscillator 31, the non-crystal oscillator 32, and the clock adjustment circuit 34. The switching circuit 33 may receive the signals CLK(1) and CLK(2). The switching circuit 33 may generate a signal CLK(3) (also referred to as a reference clock signal) according to one of the signals CLK(1) and CLK(2). The switching circuit 33 may provide the signal CLK(3) to the clock adjustment circuit 34. In an exemplary embodiment, the switching circuit 33 may provide one of the signals CLK(1) and CLK(2) as a reference clock signal to the clock adjustment circuit 34 according to the instruction of the signal CTRL.

The clock adjustment circuit 34 may include the clock adjustment circuit 121 of FIG. 1. The clock adjustment circuit 34 may generate the signal CLK according to the signal CTRL and the signal CLK(3) (i.e., the reference clock signal) from the switching circuit 33.

In an exemplary embodiment, the switching circuit 33 may provide, in the first mode, the signal CLK(1) as a reference clock signal (i.e., the signal CLK(3)) to the clock adjustment circuit 34 according to the instruction of the signal CTRL. Then, the clock adjustment circuit 34 may adjust the frequency of the signal CLK(3) according to the frequency difference between the signals S(1) and CLK to generate the signal CLK having a specific frequency.

In an exemplary embodiment, the switching circuit 33 may provide, in the second mode, the signal CLK(2) as a reference clock signal (i.e., the signal CLK(3)) to the clock adjustment circuit 34 according to the instruction of the signal CTRL. Then, the clock adjustment circuit 34 may adjust the frequency of the signal CLK(3) according to the instruction of the signal CTRL to generate the signal CLK having a specific frequency.

In an exemplary embodiment, the switching circuit 33 may also provide, in the first mode, the signal CLK(2) as a reference clock signal (i.e., the signal CLK(3)) to the clock adjustment circuit 34, and/or the switching circuit 33 may provide, in the second mode, the signal CLK(1) as a reference clock signal (i.e., the signal CLK(3)) to the clock adjustment circuit 34.

In an exemplary embodiment, in both the first mode and the second mode, the switching circuit 33 may provide the signal CLK(1) as a reference clock signal (i.e., the signal CLK(3)) to the clock adjustment circuit 34. In an exemplary embodiment, in both the first mode and the second mode, the switching circuit 33 may provide the signal CLK(2) as a reference clock signal (i.e., the signal CLK(3)) to the clock adjustment circuit 34.

In an exemplary embodiment, the clock signal generation circuit 30 does not have the crystal oscillator 31 and the non-crystal oscillator 32 at the same time. For example, in an exemplary embodiment, the clock signal generation circuit 30 may have the crystal oscillator 31 and not have the non-crystal oscillator 32. Or, in an exemplary embodiment, the clock signal generation circuit 30 may have the non-crystal oscillator 32 and not have the crystal oscillator 31. In the case that the clock signal generation circuit 30 does not have the non-crystal oscillator 32, regardless of whether the current operation mode is the first mode or the second mode, the clock adjustment circuit 34 may directly use the output of the crystal oscillator 31 (i.e., the signal CLK(1)) as a reference clock signal (i.e., the signal CLK(3)). Moreover, in the case that the clock signal generation circuit 30 does not have the crystal oscillator 31, regardless of whether the current operation mode is the first mode or the second mode, the clock adjustment circuit 34 may directly use the output of the non-crystal oscillator 32 (i.e., the signal CLK(2)) as a reference clock signal (i.e., the signal CLK(3)). In an exemplary embodiment, the switching circuit 33 may not be disposed in the clock signal generation circuit 30.

In an exemplary embodiment, the clock control circuit 10 of FIG. 1 may be disposed in one memory storage device. Alternatively, in an exemplary embodiment, the clock control circuit 10 of FIG. 1 may also be disposed in any type of electronic device, which is not limited by the invention.

In general, a memory storage device (also referred to as a memory storage system) includes a rewritable non-volatile memory module and a controller (also referred to as a control circuit). The memory storage device is generally used with a host system, such that the host system may write data to the memory storage device or read data from the memory storage device.

Figure 4:
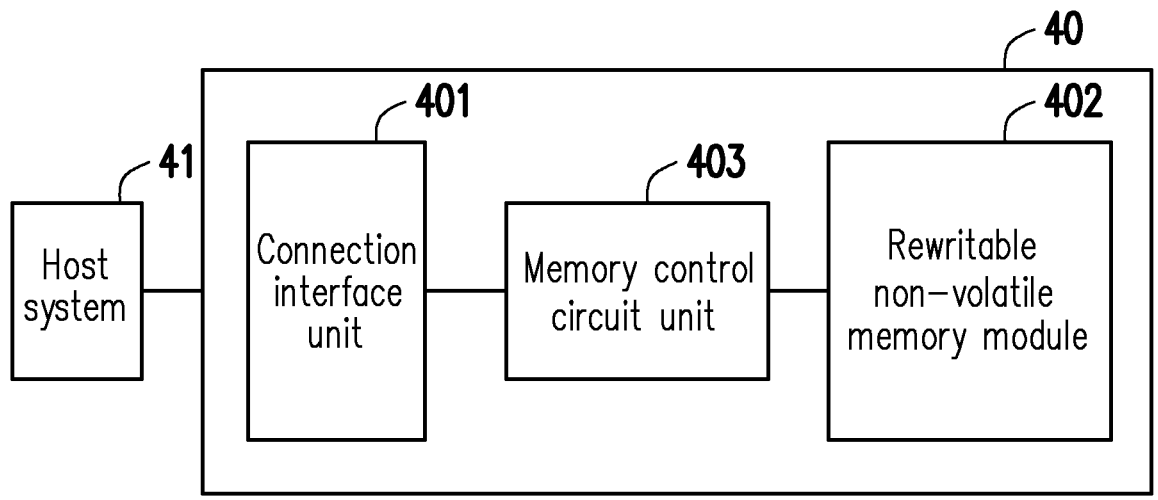
FIG. 4 is a schematic diagram of a memory storage device and a host system shown according to an exemplary embodiment of the invention.

FIG. 4 is a schematic diagram of a memory storage device and a host system shown according to an exemplary embodiment of the invention. Referring to FIG. 4, a host system 41 is coupled to a memory storage device 40. Thereby, the host system 41 may write data into the memory storage device 40 or read data from the memory storage device 40. It should be noted that the host system 41 is any system that may substantially cooperate with the memory storage device 40 to store data, such as a computer system.

The memory storage device 40 includes a connection interface unit 401, a rewritable non-volatile memory module 402, and a memory control circuit unit 403. The connection interface unit 401 is configured to couple the memory storage device 10 to the host system 41. The memory storage device 10 may communicate with the host system 41 via the connection interface unit 401. In an exemplary embodiment, the connection interface unit 401 is compatible with the Peripheral Component Interconnect Express (PCI Express) standard. In an exemplary embodiment, the connection interface unit 401 may also conform to the Serial Advanced Technology Attachment (SATA) standard, Parallel Advanced Technology Attachment (PATA) standard, Institute of Electrical and Electronic Engineers (IEEE) 1394 standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 401 may be sealed in a chip with the memory control circuit unit 403. Alternatively, the connection interface unit 401 is disposed outside of a chip containing the memory control circuit unit 403.

The memory control circuit unit 403 is coupled to the connection interface unit 401 and the rewritable non-volatile memory module 402. The memory control circuit unit 403 is configured to execute a plurality of logic gates or control commands implemented in a hardware form or in a firmware form. The memory control circuit unit 404 also performs operations such as writing, reading, and erasing data in the rewritable non-volatile memory storage module 402 according to the commands of the host system 41.

The rewritable non-volatile memory module 402 is configured to store the data written by the host system 41. The rewritable non-volatile memory module 402 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 402 stores one or a plurality of bits via the change in voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 402 has a plurality of storage statuses. Which storage status one memory cell belongs to may be determined via the application of a read voltage, so as to obtain one or a plurality of bits stored by the memory cell.

In an exemplary embodiment, the memory cells of the rewritable non-volatile memory module 402 may form a plurality of physical programming units, and these physical programming units may form a plurality of physical erasing units. Specifically, the memory cells on the same word line may form one or a plurality of physical programming units. If each of the memory cells may store 2 or more bits, the physical programming units on the same word line may be at least classified into lower physical programming units and upper physical programming units. For example, the least significant bit (LSB) of a memory cell belongs to the lower physical programming units, and the most significant bit (MSB) of a memory cell belongs to the upper physical programming units. Generally, in an MLC NAND-type flash memory, the write speed of the lower physical programming units is greater than the write speed of the upper physical programming units, and/or the reliability of the lower physical programming units is greater than the reliability of the upper physical programming units.

In an exemplary embodiment, the physical programming unit is the smallest unit of programming. That is, the physical programming unit is the smallest unit of data writing. For example, the physical programming unit may be a physical page or a physical sector. If the physical programming unit is a physical page, then the physical programming units may include a data bit area and a redundancy bit area. The data bit area contains a plurality of physical sectors configured to store user data, and the redundancy bit area is configured to store system data (for example, management data such as an error correcting code). In an exemplary embodiment, the data bit area includes 32 physical sectors, and the size of one physical sector is 512 bytes (B). However, in other exemplary embodiments, the data bit area may also contain 8, 16, or a greater or lesser number of physical sectors, and the size of each of the physical sectors may also be greater or smaller. Moreover, the physical erasing unit is the smallest unit of erasing. That is, each of the physical erase units contains the smallest number of memory cells erased together. For example, the physical erasing unit is a physical block.

In an exemplary embodiment, the clock control circuit 10 of FIG. 1 may be disposed in the memory storage device 40. For example, the clock control circuit 10 may be disposed in the connection interface unit 401. In an exemplary embodiment, the signal S(1) may include a signal from the host system 41. Therefore, the frequency of the signal S(1) may also reflect the frequency of the host system 41.

In an exemplary embodiment, no matter whether the frequency of the signal S(1) is tracked or not, the frequency of the signal CLK used inside the memory storage device 40 may be adjusted to be consistent with the frequency of the signal S(1) as much as possible (e.g., close to or equal to each other). Thereby, the memory storage device 40 (or the connection interface unit 401) may establish a connection with the host system 41 via the adjusted signal CLK and transmit signals to each other based on the same or similar frequency.

Figure 5:
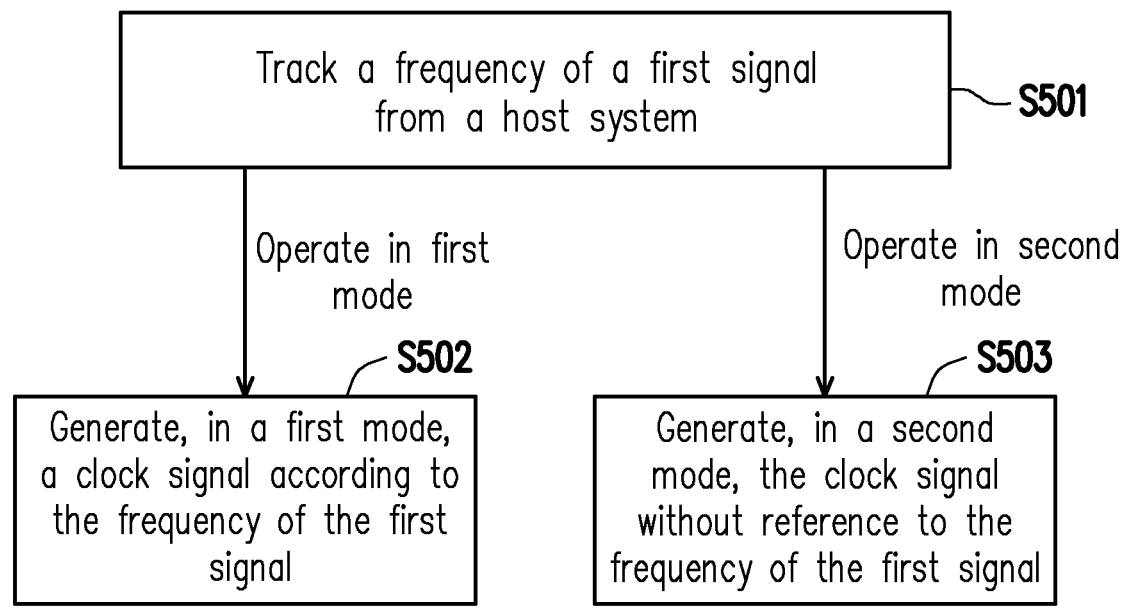
FIG. 5 is a flowchart of a clock control method shown according to an exemplary embodiment of the invention.

FIG. 5 is a flowchart of a clock control method shown according to an exemplary embodiment of the invention. Please refer to FIG. 5, in step S501, a frequency of a first signal from a host system is tracked. According to different operation modes, one of steps S502 and S503 may be executed. In step S502, a clock signal is generated, in a first mode, according to the frequency of the first signal. In addition, in step S503, the clock signal is generated, in a second mode, without reference to the frequency of the first signal.

However, each step in FIG. 5 is as described in detail above, and is not repeated herein. It should be mentioned that, each step in FIG. 5 may be implemented as a plurality of program codes or circuits, and the invention is not limited thereto. Moreover, the method of FIG. 5 may be used with the above exemplary embodiments, and may also be used alone, and the invention is not limited thereto.

Based on the above, the clock control method, the memory storage device, and the memory control circuit unit provided by the exemplary embodiments of the invention may dynamically determine whether to generate the clock signal with reference to the frequency of the first signal from the host system. In this way, no matter how the frequency of the host system is changed, the clock signal of the memory storage device may be effectively adjusted.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A clock control circuit, comprising:
   a frequency tracking circuit;
   a clock signal generation circuit coupled to the frequency tracking circuit; and
   a control circuit coupled to the frequency tracking circuit and the clock signal generation circuit,
   wherein the frequency tracking circuit is configured to track a frequency of a first signal from a host system,
   the control circuit is configured to control the clock signal generation circuit to generate, in a first mode, a clock signal according to the frequency of the first signal, and
   the control circuit is further configured to control the clock signal generation circuit to generate, in a second mode, the clock signal without reference to the frequency of the first signal.

2. The clock control circuit of claim 1, wherein the control circuit is further configured to decide to be operated in the first mode or the second mode according to a frequency difference between the first signal and the clock signal.

3. The clock control circuit of claim 2, wherein the control circuit is operated in the first mode in response to the frequency difference being not greater than a default value, and
   the control circuit is operated in the second mode in response to the frequency difference being greater than the default value.

4. The clock control circuit of claim 2, wherein the control circuit is further configured to obtain a parameter value according to a frequency tracking result of the frequency tracking circuit, and the parameter value reflects the frequency difference between the first signal and the clock signal.

5. The clock control circuit of claim 1, wherein the control circuit is further configured to decide to be operated in the first mode or the second mode according to a transmission standard of the first signal.

6. The clock control circuit of claim 1, wherein in the first mode, the control circuit adjusts a frequency of the clock signal according to a frequency difference between the first signal and the clock signal.

7. The clock control circuit of claim 1, wherein in the second mode, the control circuit adjusts a frequency of the clock signal according to a temperature value.

8. The clock control circuit of claim 7, wherein the control circuit comprises:
   a register configured to store a plurality of compensation parameters,
   the control circuit adjusts, in the second mode, the frequency of the clock signal using one of the plurality of compensation parameters according to the temperature value.

9. The clock control circuit of claim 1, wherein the clock signal generation circuit comprises:
   a clock adjustment circuit coupled to the control circuit and configured to generate the clock signal, and
   the control circuit adjusts, in the second mode, a setting value of the clock adjustment circuit according to a compensation parameter.

10. The clock control circuit of claim 1, wherein the clock signal is generated by one of a non-crystal oscillator and a crystal oscillator in the clock signal generation circuit.

11. The clock control circuit of claim 1, wherein the clock signal generation circuit supports adjusting, in the first mode, the clock signal within a first frequency adjustment range, the clock signal generation circuit supports adjusting, in the second mode, the clock signal within a second frequency adjustment range, and the first frequency adjustment range is different from the second frequency adjustment range.

12. A memory storage device, comprising:
a connection interface unit configured to be coupled to a host system;
a rewritable non-volatile memory module;
a memory control circuit unit coupled to the connection interface unit and the rewritable non-volatile memory module; and
a clock control circuit disposed in the connection interface unit,
wherein the clock control circuit is configured to:
  track a frequency of a first signal from the host system;
  generate, in a first mode, a clock signal according to the frequency of the first signal; and
  generate, in a second mode, the clock signal without reference to the frequency of the first signal.

13. The memory storage device of claim 12, wherein the clock control circuit is further configured to decide to be operated in the first mode or the second mode according to a frequency difference between the first signal and the clock signal.

14. The memory storage device of claim 13, wherein the clock control circuit is operated in the first mode in response to the frequency difference being not greater than a default value, and the clock control circuit is operated in the second mode in response to the frequency difference being greater than the default value.

15. The memory storage device of claim 13, wherein the clock control circuit is further configured to obtain a parameter value according to a frequency tracking result, and the parameter value reflects the frequency difference between the first signal and the clock signal.

16. The memory storage device of claim 12, wherein the clock control circuit is further configured to decide to be operated in the first mode or the second mode according to a transmission standard of the first signal.

17. The memory storage device of claim 12, wherein the clock control circuit adjusts, in the first mode, a frequency of the clock signal according to a frequency difference between the first signal and the clock signal.

18. The memory storage device of claim 12, wherein the clock control circuit adjusts, in the second mode, a frequency of the clock signal according to a temperature value.

19. The memory storage device of claim 18, wherein the clock control circuit comprises:
a register configured to store a plurality of compensation parameters,
the clock control circuit adjusts, in the second mode, the frequency of the clock signal using one of the plurality of compensation parameters according to the temperature value.

20. The memory storage device of claim 12, wherein the clock control circuit comprises:
a clock adjustment circuit configured to generate the clock signal, and
the clock control circuit adjusts, in the second mode, a setting value of the clock adjustment circuit according to a compensation parameter.

21. The memory storage device of claim 12, wherein the clock signal is generated by one of a non-crystal oscillator and a crystal oscillator in the clock control circuit.

22. The memory storage device of claim 12, wherein the clock control circuit supports adjusting, in the first mode, the clock signal within a first frequency adjustment range, the clock control circuit supports adjusting, in the second mode, the clock signal within a second frequency adjustment range, and the first frequency adjustment range is different from the second frequency adjustment range.

23. A clock control method, configured for a memory storage device, the clock control method comprising:
tracking a frequency of a first signal from a host system;
generating, in a first mode, a clock signal according to the frequency of the first signal; and
generating, in a second mode, the clock signal without reference to the frequency of the first signal.

24. The clock control method of claim 23, further comprising:
deciding to be operated in the first mode or the second mode according to a frequency difference between the first signal and the clock signal.

25. The clock control method of claim 24, wherein the step of deciding to be operated in the first mode or the second mode according to the frequency difference between the first signal and the clock signal comprises:
operating in the first mode in response to the frequency difference being not greater than a default value; and
operating in the second mode in response to the frequency difference being greater than the default value.

26. The clock control method of claim 24, further comprising:
obtaining a parameter value according to a frequency tracking result, and the parameter value reflects the frequency difference between the first signal and the clock signal.

27. The clock control method of claim 23, further comprising:
deciding to be operated in the first mode or the second mode according to a transmission standard of the first signal.

28. The clock control method of claim 23, wherein the step of generating, in the first mode, the clock signal according to the frequency of the first signal comprises:
adjusting, in the first mode, a frequency of the clock signal according to a frequency difference between the first signal and the clock signal.

29. The clock control method of claim 23, wherein the step of generating, in the second mode, the clock signal without reference to the frequency of the first signal comprises:
adjusting, in the second mode, a frequency of the clock signal according to a temperature value.

30. The clock control method of claim 29, wherein the step of adjusting, in the second mode, the frequency of the clock signal according to the temperature value comprises:
adjusting, in the second mode, the frequency of the clock signal using one of a plurality of compensation parameters according to the temperature value.

31. The clock control method of claim 23, wherein the step of generating, in the second mode, the clock signal without reference to the frequency of the first signal comprises:
generating the clock signal via a clock adjustment circuit; and adjusting, in the second mode, a setting value of the clock adjustment circuit according to a compensation parameter.

32. The clock control method of claim 23, wherein the clock signal is generated by one of a non-crystal oscillator and a crystal oscillator in the memory storage device.

33. The clock control method of claim 23, further comprising:
adjusting, in the first mode, the clock signal within a first frequency adjustment range; and
adjusting, in the second mode, the clock signal within a second frequency adjustment range, wherein the first frequency adjustment range is different from the second frequency adjustment range.

* * * * *